US009003728B2

(12) United States Patent
Asci et al.

(10) Patent No.: US 9,003,728 B2
(45) Date of Patent: *Apr. 14, 2015

(54) MODULAR, SELF SUPPORTING EXTERIOR ENCLOSURE SYSTEM WITH INSULATING, EVACUATED TUBES HAVING SOLAR COLLECTOR RODS

(71) Applicant: Skidmore, Owings & Merrill LLP, New York, NY (US)

(72) Inventors: Aybars Asci, New York, NY (US); Gary Haney, New York, NY (US); Teresa Rainey, New York, NY (US); Christopher Olsen, New York, NY (US); Elizabeth Boone, New York, NY (US)

(73) Assignee: Skidmore, Owings & Merrill LLP, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/262,119

(22) Filed: Apr. 25, 2014

(65) Prior Publication Data

US 2015/0059828 A1  Mar. 5, 2015

Related U.S. Application Data

(63) Continuation-in-part of application No. 14/015,071, filed on Aug. 30, 2013.

(51) Int. Cl.
| | | |
|---|---|---|
| *E04D 13/18* | (2014.01) | |
| *H02S 20/26* | (2014.01) | |
| *F24J 2/52* | (2006.01) | |
| *F24J 2/42* | (2006.01) | |
| *F24J 2/46* | (2006.01) | |
| *F24J 2/51* | (2006.01) | |
| *E04B 2/88* | (2006.01) | |
| *H01L 31/054* | (2014.01) | |
| *H01L 31/048* | (2014.01) | |

(52) U.S. Cl.
CPC .............. *H02S 20/26* (2014.12); *F24J 2/5201* (2013.01); *F24J 2/42* (2013.01); *F24J 2/464* (2013.01); *F24J 2/51* (2013.01); *F24J 2/465* (2013.01); *F24J 2/5245* (2013.01); *E04B 2/88* (2013.01); *H01L 31/0543* (2014.12); *H01L 31/048* (2013.01); *F24J 2002/5215* (2013.01)

(58) Field of Classification Search
CPC ......... Y02E 10/40; Y02E 10/47; Y02E 10/50; Y02E 10/52
USPC ....................................................... 52/173.3
See application file for complete search history.

(56) References Cited

U.S. PATENT DOCUMENTS

| | | | | |
|---|---|---|---|---|
| 4,120,285 | A | | 10/1978 | Nugent |
| 4,149,523 | A | * | 4/1979 | Boy-Marcotte et al. ....... 126/589 |
| 4,202,715 | A | * | 5/1980 | Ziemba ............................ 156/71 |
| 4,217,147 | A | * | 8/1980 | Ziemba .......................... 136/248 |
| 4,220,136 | A | * | 9/1980 | Penney .......................... 126/600 |

(Continued)

OTHER PUBLICATIONS

International Search Report corresponding to PCT/US14/51576 dated Dec. 5, 2014.

*Primary Examiner* — Mark Wendell
(74) *Attorney, Agent, or Firm* — Dentons US LLP (57) ABSTRACT

A tubular building enclosure system with thermally-broken modules having evacuated air spaces assembled in rows and/or columns to form a structurally self-supporting, thermally insulating, and solar energy collecting facade.

20 Claims, 7 Drawing Sheets

(56) References Cited

U.S. PATENT DOCUMENTS

| | | | |
|---|---|---|---|
| 4,429,545 A | 2/1984 | Steinberg | |
| 4,452,233 A * | 6/1984 | Goodman et al. | 126/653 |
| 8,381,454 B1 | 2/2013 | Robinson | |
| 2007/0283949 A1* | 12/2007 | Levin | 126/573 |
| 2011/0011009 A1* | 1/2011 | Claerhout et al. | 52/63 |
| 2011/0045627 A1* | 2/2011 | Sachs et al. | 438/71 |
| 2011/0132434 A1 | 6/2011 | Correia et al. | |
| 2011/0297142 A1* | 12/2011 | Chung | 126/601 |
| 2012/0023841 A1* | 2/2012 | Renna | 52/173.3 |
| 2012/0167492 A1* | 7/2012 | Cummings | 52/173.3 |
| 2012/0175082 A1 | 7/2012 | Kmetovicz et al. | |
| 2012/0186579 A1* | 7/2012 | Dopp et al. | 126/684 |

* cited by examiner

MODULAR, SELF SUPPORTING EXTERIOR ENCLOSURE SYSTEM WITH INSULATING, EVACUATED TUBES HAVING SOLAR COLLECTOR RODS

CROSS-REFERENCE TO RELATED APPLICATION

This Patent Application claims priority to U.S. patent application Ser. No. 14/015,071 titled Modular, Self Supporting Exterior Enclosure System With Insulating, Evacuated Tubes Having Solar Collector Rods, and filed Aug. 30, 2013, the entire contents of which are herein incorporated by reference in its entirety.

BACKGROUND OF THE INVENTION

1. Field of the Invention

The present invention relates to static building structures, and more particularly, to a tubular enclosure system configured to control an interior environment thereof and convert solar radiation to electricity, and to methods of erecting and using the system.

2. Description of Related Art

Conventional building enclosures suffer from a number of problems, particularly enclosures equipped with windows or glazed portions. Undesirable ambient energy transfer is highest on glazed portions of the enclosures. Such energy transfer results in increased heating and cooling requirements to maintain an enclosed interior space at a desired temperature.

In attempt to reduce ambient energy transfer, designs for enclosures may limit the exposed area of glazed portions. Additionally, glazed portions may be treated via application of a high-performance coating or with increased glazing, e.g., double or triple glazing. Each of these options, however, includes undesirable effects.

Reducing the exposed area of glazed portions limits views to an exterior environment of the enclosures, which is undesirable to inhabitants and other users. Further, it reduces or eliminates the amount of natural light that is allowed to enter the enclosure, thereby increasing demand for artificial lighting to illuminate the interior of enclosures, which results in increased energy consumption. Artificial light is also undesirable because it is typically of poor quality, e.g., has a poor color rendition index relative to natural light.

Other related art includes flat glass with air removed from an interior thereof. Such flat glass is susceptible to bowing from pressure exerted by the lack of air in the interior. To address the pressure and avoid bowing, spacers may be installed in the interior between layers of insulated glass. The spacers, however, act as thermal bridges and cause heat to flow more easily through the interior and be transferred between the layers of insulated glass. Additionally, flat glass is not self-supporting and requires additional structural support upon assembly.

Related art also includes non-flat glass. For instance, U.S. Pat. No. 4,038,797 to Hermann, which is incorporated by reference herein in its entirety, is directed to tubes having cylindrical sections. The Hermann tubes are manufactured as extruded glass, which necessarily includes undesirable manufacturing limitations when large diameters and/or long lengths are required for an application. The Hermann disclosure also fails to provide a workable structure for arranging or supporting the tubes for use in a variety of challenging structural settings. Further, the Hermann tubes do not independently seal an enclosure or form a thermal break and, therefore, require additional material in the form of supplemental panes of glass.

Thus, there is a need for a building enclosure system with an unrestricted area of glazed portions to allow light to pass into an interior thereof while reducing energy transfer between the interior and an exterior of the system. Additionally, it is desirable that the system be easy to assemble, self-supporting to minimize materials necessary for assembly and use of the system, and include components that minimize energy consumption necessary to maintain the enclosed interior space, e.g., temperature, of the enclosure.

SUMMARY OF THE INVENTION

Systems and methods consistent with the present inventive concept overcome the aforementioned problems and provide a modular building enclosure system having tubular components for unitized assembly in rows and/or columns to form at least one wall or portion of a wall, e.g., a facade, of an enclosure such as a commercial or residential space. The tubular building enclosure system is structurally self-supporting, thermally insulates the enclosure via providing a seal between an interior and exterior of the enclosure, configured to direct light to a focal point and/or to collect solar energy at or near the focal point.

The system of the present inventive concept provides a modular interlocking building enclosure system via a plurality of tubular glass units. The system is configured to be at least partially assembled in a location remote from a project site, and arrive at the project site for further assembly in a grid. Each of the tubular glass units are mostly or fully-evacuated of air and other gases to provide a thermal break or seal between an interior and exterior of the system, and configured to be joined together via interlocking fasteners and stacked in horizontal rows and/or vertical rows to form the grid.

The system of the present inventive concept is self-supporting due at least in part to a structural depth of each of the tubular glass units. Geometrical properties of the tubular glass units also maintain an airless or vacuum chamber without any additional structural support. The vacuum chamber advantageously significantly reduces or eliminates conductive and convective heat transfer through the tubular glass units, thereby allowing the system to provide a thermal buffer or insulator for both hot and cold climates. Each of the tubular glass units includes a convex outer half glass-lite configured to refract and focus incoming solar radiation to an approximate center of the chamber, thereby concentrating the energy to a focal point and enabling a solar collector positioned at or near the center to generate power. In this manner, the system is configured to extract solar power radiating partially through the glass tubes while eliminating solar heat loads.

In its simplest form, the system of the present inventive concept includes a grid of independently attached, interconnected units. Each of the units are pre-fabricated in a controlled shop environment from a kit of uniform, custom-fabricated components. Each of the units is constructed of two curved pieces of laminated glass having a uniform or non-uniform radius, thermally-broken metal, e.g., aluminum extrusion, or other like material of sufficient strength, and plate framing, structural and weather seals and gaskets, setting hardware and stainless steel trim. The system includes a sub-structural suspension network with each of the units precisely placed and secured in repeating rows and columns. The components of each unit, i.e., their perimeter detailing, seal each of the units against each other to create a building enclosure. Each of the units includes an interior void enclosed by a plurality of walls of which at least one is configured to allow light incident thereon to at least partially pass therethrough. Each of the units houses at least a portion of a solar energy photovoltaic rod positioned at a focal point at an approximate center of an interior void. The focal point is defined by the at least one wall. The system provides a building enclosure with a fully glazed facade having an R-value comparable to an insulated solid wall. The system is configured to be assembled in connection with any building type. The system, via each of the units, is configured to create translucency and/or opacity to permit versatility for various designs.

The aforementioned may be achieved in one aspect of the present inventive concept by providing a modular wall system having a plurality of evacuated air spaces, thereby providing a thermal break within the system. The system may include a plurality of thermally-broken interconnected units. Each unit may include a top end plate, a bottom end plate, a convex exterior sidewall, an interior sidewall, and/or an interior void. The interior void may be defined by the top end plate, the bottom end plate, the convex exterior sidewall, and/or the interior sidewall. Each of the sidewalls may extend between the top end plate and the bottom end plate. Each of the units may be connected horizontally via one or more horizontal connectors and/or vertically via one or more vertical connectors. Each unit may be configured to form at least a portion of or an entirety of the thermal break. Each unit includes a single evacuated air space and provides a portion of the thermal break of the system. The thermal break of the system is collaboratively formed by each unit and at least one sealing component positioned between each unit and preferably at least two sealing components positioned between each unit.

Each of the units may include a solar energy collection rod extending vertically within the interior void. The rod may be positioned substantially at a focal point defined by the convex exterior sidewall. The rod may extend vertically within the interior void from the top end plate to the bottom end plate. The rod may contain a photovoltaic material. The photovoltaic material may be made of one or a combination of monocrystalline silicon, polycrystalline silicon, amorphous silicon, cadmium telluride, and/or copper indium gallium selenide/sulfide. The interior may be partially or completely evacuated of air and/or all other gases to form a vacuum.

The outer surface of the exterior sidewall may have a radius equal to a radius of an outer surface of the interior sidewall such that, when the exterior sidewall and the interior sidewall are secured to each other, the exterior sidewall and the interior sidewall collectively form a tubular self-supporting columnar member. It is foreseen, however, that the radius of the exterior sidewall may be different than the radius of the outer surface of the interior sidewall without deviating from the scope of the present inventive concept. The form or flatness of the radius may be determined by the structural shape required to resist the force created by the negative pressure of the evacuated air space. Each of the exterior sidewall and the interior sidewall may include an outer layer and an inner layer. The outer layer and inner layer may be spaced from each other via an interlayer. The interior sidewalls may be bonded together at interior linear joints therebetween via an adhesive. The exterior sidewalls may be bonded to a spacer at exterior linear joints therebetween via an adhesive.

The interior linear joints may be horizontally displaced from the exterior linear joints. The spacer may extend along the interior linear joint, space the exterior sidewalls from each other, and/or include a projection with a receiver at a distal end thereof. The projection may extend obliquely from the spacer, and may include a contoured outer surface to at least partially receive a fastener. The fastener may at least partially nest in and along the contoured outer surface.

The receiver may include one or more vertical grooves extending, e.g., vertical and/or parallel to each other, along a length of the receiver. The grooves may be configured to partially receive a surface, e.g., a rear surface, of a gasket. The surface of the gasket may abut exterior sidewalls of adjacent ones of the plurality of interconnected units. The spacer may cooperate with another spacer of an adjacent one of the plurality of interconnected units to completely surround a perimeter of the fastener. The spacer and/or the another spacer may form at least a portion of the thermal break, i.e., a remaining portion of the thermal break partially formed by each unit.

The another spacer of the adjacent one of the plurality of interconnected units may extend along an interior linear joint of the adjacent one of the plurality of interconnected units. The another spacer of the adjacent one of the plurality of interconnected units may space exterior sidewalls of the adjacent one of the plurality of interconnected units from each other. The another spacer of the adjacent one of the plurality of interconnected units may include a projection with a receiver at a distal end thereof.

The projection may extend obliquely from the spacer. The projection may include a contoured outer surface to at least partially receive a fastener. The receiver may include one or more vertical grooves extending, e.g., horizontal and/or parallel to each other, along a length of the receiver. The grooves may be configured to at least partially receive a surface, e.g., a rear surface of a gasket. The surface of the gasket may abut exterior sidewalls of adjacent ones of the plurality of interconnected units.

Each of the top end plate and the bottom end plate may include a groove along a surface thereof, e.g., about a circumference thereof. The groove may be configured to at least partially receive a surface, e.g., a side surface, of a gasket. The surface of the gasket may abut one or more plates of adjacent ones of the plurality of interconnected units. Each of the top end plate and the bottom end plate may include a frame projecting into the interior void. The frame may be secured, e.g., via a friction fit, an adhesive bond, and/or an abutting engagement, to the exterior sidewall and/or the interior sidewall. The frame may at least partially house an insulating material therein.

The aforementioned may be achieved in another aspect of the present inventive concept by providing a method to generate electric power via a modular wall system. The method may include the step of connecting a plurality of units. Each unit may include a top end plate, a bottom end plate, a convex exterior sidewall, an interior sidewall, and/or an interior void. The interior void may be defined by the top end plate, the bottom end plate, the convex exterior sidewall, and/or the interior sidewall. Each of the sidewalls may extend at least partially between the top end plate and the bottom end plate. Each of the units may include a solar energy collection element, e.g., an elongated rod extending vertically within the interior void. The solar collection element may be positioned substantially at a focal point defined by the convex exterior sidewall.

The rod may extend vertically and/or horizontally within the interior void, e.g., at least partially between and/or from the top end plate to the bottom end plate. The solar collection element may contain a photovoltaic material. The interior may be at least partially evacuated of gases. The outer surface of the exterior sidewall may have a radius equal to or unequal to a radius of an outer surface of the interior sidewall such that, when the exterior sidewall and the interior sidewall are secured to each other, the exterior sidewall and the interior sidewall collectively form a tubular columnar member.

The aforementioned may be achieved in another aspect of the present inventive concept by providing a method of generating electric power via an array of solar energy receivers at least partially encased in a modular wall system. The method may include the step of connecting a plurality of units. Each unit may have a top end plate, a bottom end plate, an exterior sidewall, an interior sidewall, and/or an interior void. The interior void may be defined by the top end plate, the bottom end plate, the convex exterior sidewall, and/or the interior sidewall.

The exterior sidewall of each unit may be configured to focus light incident on the exterior sidewall of each unit into the interior void. Each of the sidewalls may extend between the top end plate and the bottom end plate. Each of the units may include one of the solar energy receivers positioned at a focal point defined by the exterior sidewall of each unit, and/or configured to convert energy from the light to generate electric power. Each of the solar energy receivers may include an elongated rod extending vertically within the interior void, and/or spaced from each of the sidewalls. The rod may contain a photovoltaic material. The exterior sidewall may have a convex outer surface. The outer surface of the exterior sidewall may have a radius equal to or unequal to a radius of an outer surface of the interior sidewall such that, when the exterior sidewall and the interior sidewall are secured to each other, the exterior sidewall and the interior sidewall collectively form a tubular columnar member.

The aforementioned may be achieved in another aspect of the present inventive concept by providing a method of erecting a modular wall system. The method may include the step of positioning a solar energy receiver within each interior void of a plurality of units. Each unit may include a top end plate, a bottom end plate, an exterior sidewall, and/or an interior sidewall. The interior void may be defined by the top end plate, the bottom end plate, the convex exterior sidewall, and/or the interior sidewall. The method may include the step of evacuating the interior void of the plurality of units. The method may include the step of connecting the plurality of units to form a grid.

Each of the sidewalls may extend between the top end plate and the bottom end plate. Each of the solar energy receivers may be positioned at a focal point defined by the exterior sidewall. The outer surface of the exterior sidewall may have a radius equal to or unequal to a radius of an outer surface of the interior sidewall such that, when the exterior sidewall and the interior sidewall are secured to each other, the exterior sidewall and the interior sidewall collectively form a tubular columnar member.

Other systems, methods, features, and advantages of the present inventive concept will be or will become apparent to one with skill in the art upon examination of the following figures and detailed description. It is intended that all such additional systems, methods, features, and advantages be included within this description, be within the scope of the present inventive concept, and be protected by the accompanying claims.

BRIEF DESCRIPTION OF THE DRAWINGS

The accompanying figures, which are incorporated in and constitute a part of this specification, illustrate an implementation of the present inventive concept and, together with the description, serve to explain the advantages and principles of the present inventive concept. In the figures.

The figures do not limit the present inventive concept to the specific examples disclosed and described herein and are not necessarily to scale.

DETAILED DESCRIPTION OF THE INVENTION

The following detailed description references the accompanying figures that illustrate the present inventive concept. The illustrations and description are intended to describe aspects of the present inventive concept in sufficient detail to enable those skilled in the art to practice the present inventive concept. Other components can be utilized and changes can be made without departing from the scope of the present inventive concept. The following detailed description is, therefore, not to be taken in a limiting sense. The scope of the present inventive concept is defined only by the appended claims, along with the full scope of equivalents to which such claims are entitled.

In this description, references to an "embodiment" or "embodiments" mean that the feature or features being referred to are included in at least one embodiment of the present inventive concept. Separate references to an "embodiment" or "embodiments" do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present inventive concept can include a variety of combinations and/or integrations of the embodiments described herein.

Figure 1:
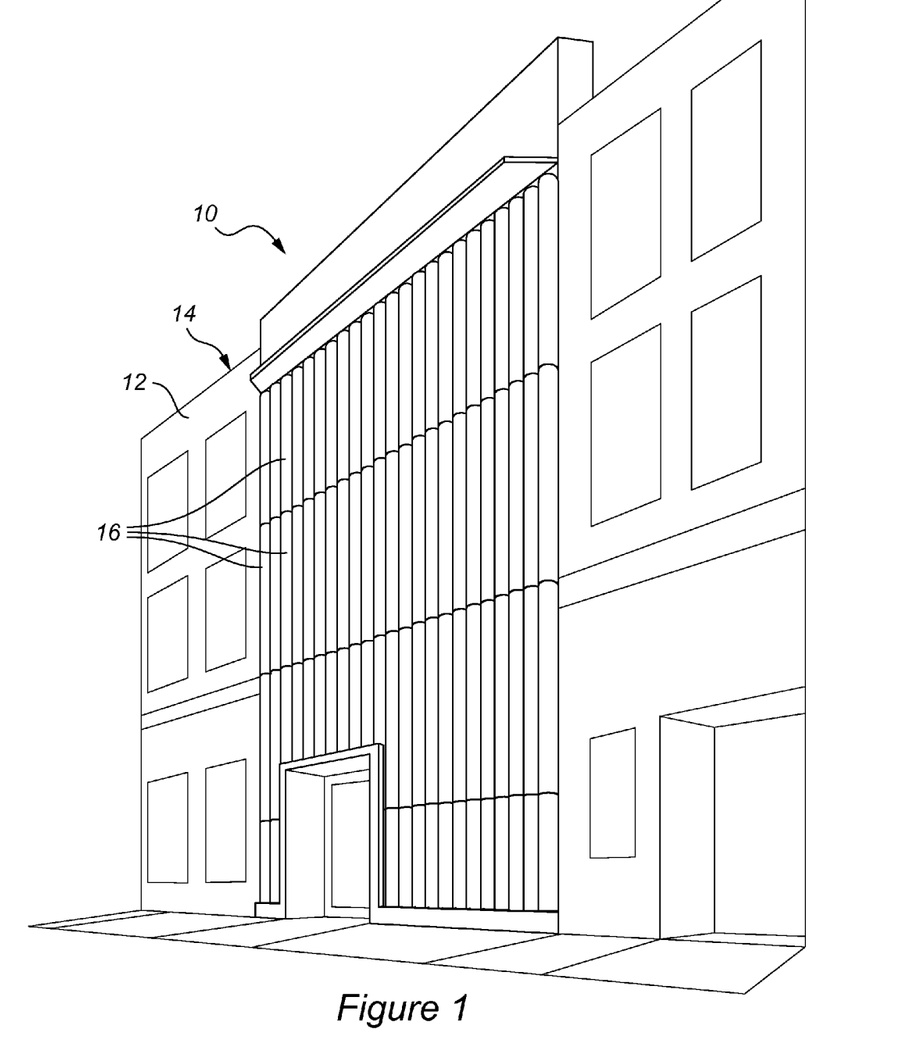
FIG. 1 is a perspective view of an exemplary modular building enclosure system consistent with the present inventive concept.

Turning to FIG. 1, a modular building enclosure system 10 assembled as a facade or a portion of a front wall 12 of an enclosure 14 having an enclosed interior space is illustrated. The system 10 includes a plurality of tubular units 16 interconnected to form the portion of the front wall 12 of the enclosure 14, thereby providing a seal between an interior and exterior of the enclosure 14. In the illustrated embodiment, the plurality of tubular units 16 are arranged side-by-side in horizontal rows and vertically stacked on top of each other in vertical columns. It is foreseen, however, that the plurality of tubular units 16 may be arranged together without limitation, e.g., only arranged side-by-side rows, only stacked vertically, and/or arranged around bends and/or corners, e.g., connected to each other at ninety degrees, to accommodate a wide variety of applications without deviating from the scope of the present inventive concept.

Figure 2:
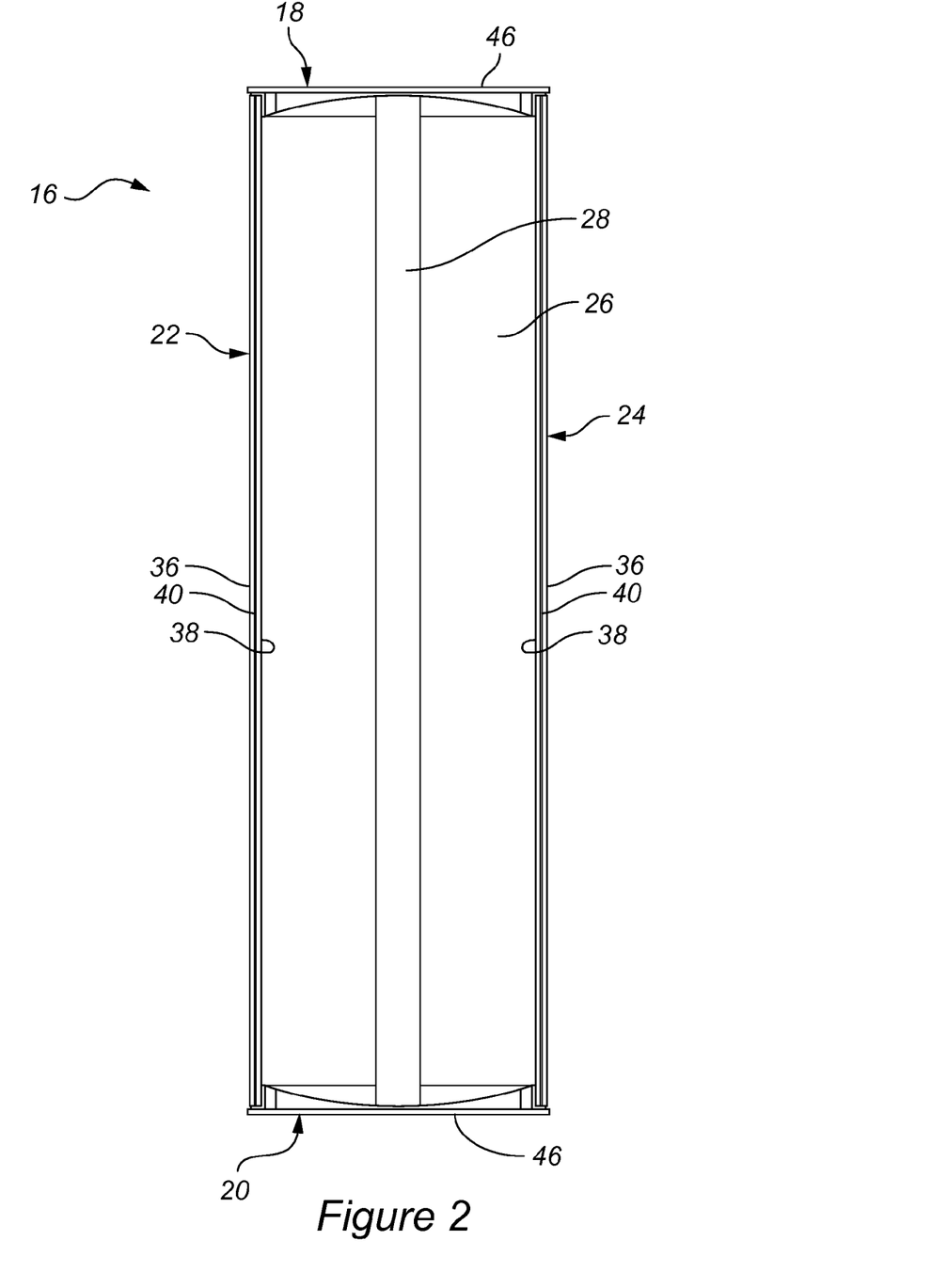
FIG. 2 is a side view of a tubular unit of the enclosure system of FIG. 1.
Figure 3:
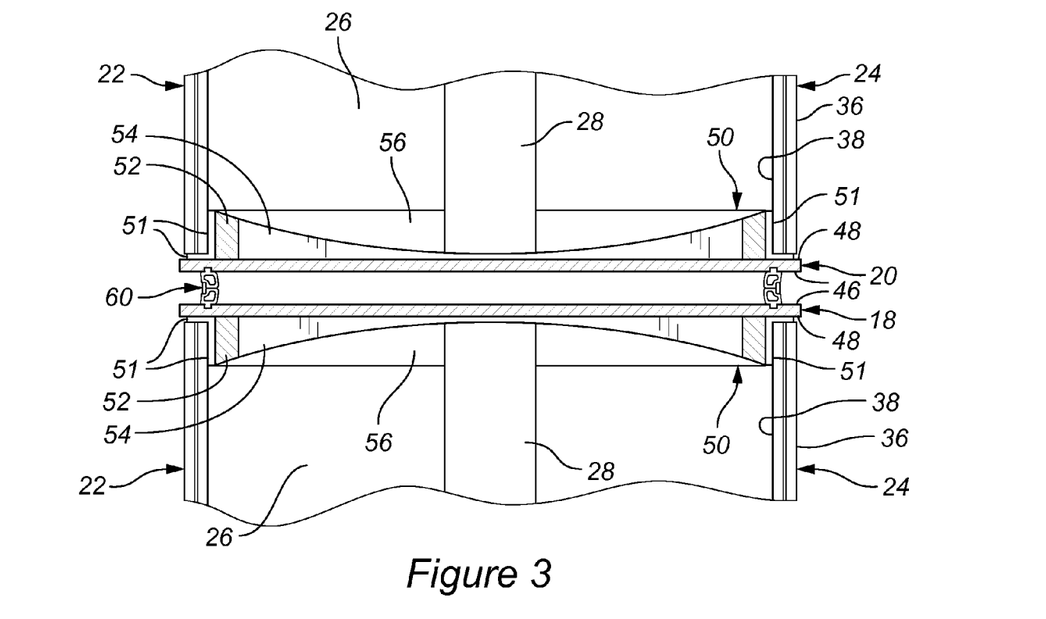
FIG. 3 is a magnified side view of the enclosure system as shown in FIG. 2, illustrating a vertical connector connecting the tubular units of the enclosure system.
Figure 4:
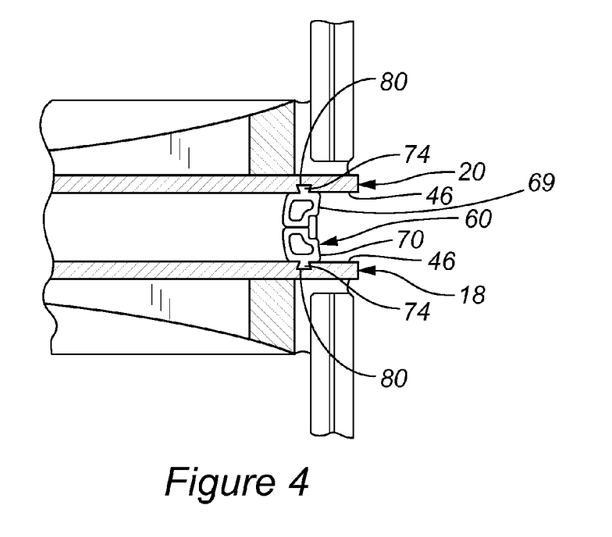
FIG. 4 is a magnified side view of the enclosure system as shown in FIG. 2, illustrating the vertical connector connecting the tubular units of the enclosure system.
Figure 5:
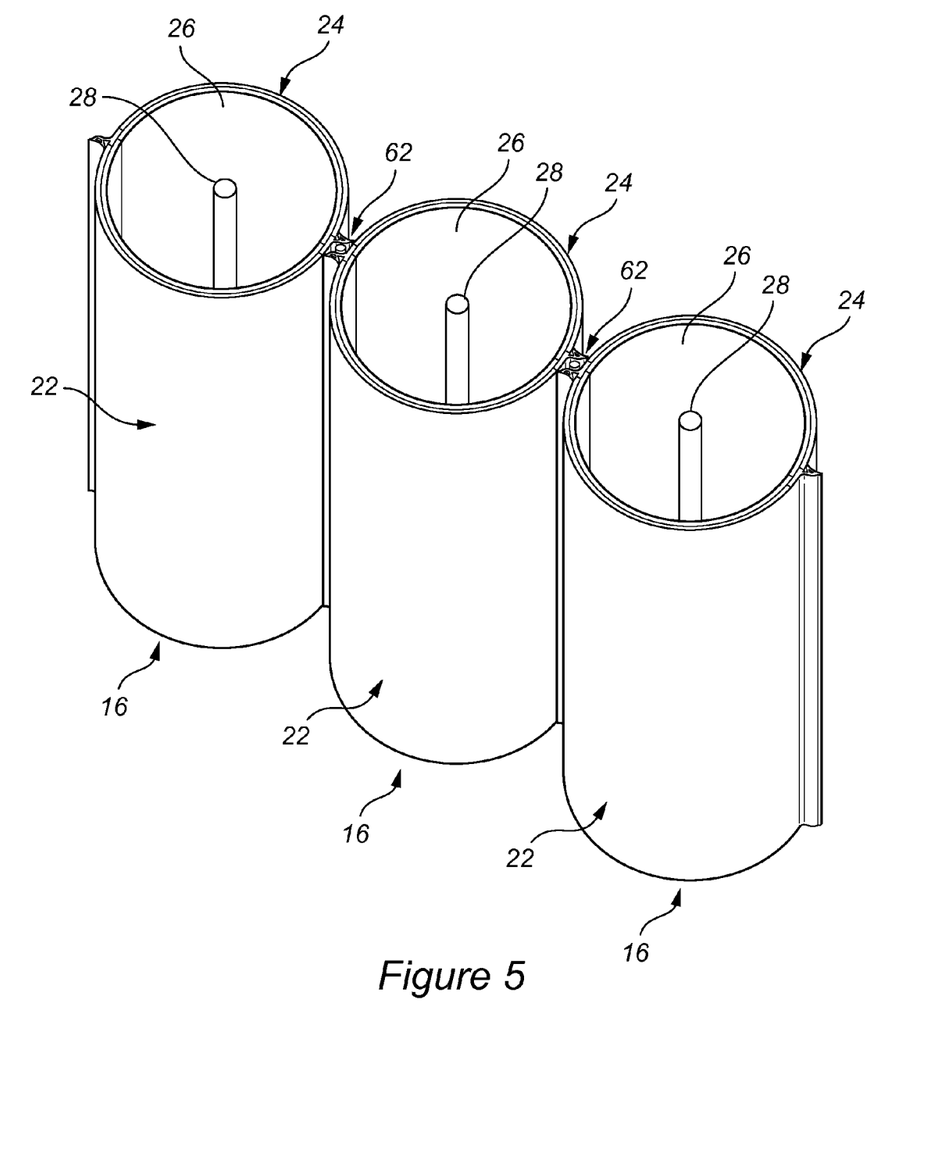
FIG. 5 is a perspective view of a plurality of tubular units of the enclosure system of FIG. 1, illustrating the plurality of tubular units horizontally connected.

Each of the tubular units 16 includes a top end plate 18, a bottom end plate 20, a convex exterior sidewall 22, and a convex interior sidewall 24, as illustrated by FIGS. 2-4. The sidewalls 22, 24 extend between and connect the end plates 18, 20 to each other. The sidewalls 22, 24 have radiuses that are equal to each other and, therefore, cooperatively form a self-supporting tubular columnar member having a uniform radius about a circumference defined by the sidewalls 22, 24. It is foreseen that the sidewalls 22, 24 may have different radiuses from each other without deviating from the scope of the present inventive concept.

The top end plate 18, the bottom end plate 20, the convex exterior sidewall 22, and the convex interior sidewall 24 are sealed together and cooperatively define a chamber or interior void 26. During assembly of each of the units 16, e.g., at a location remote from the assembly or project site, the interior void 26 is at least partially evacuated of gases and preferably completely evacuated of all gases so that a vacuum is formed therein. The geometric shape of each of the units 16 facilitates maintenance of the vacuum in the interior void 26 without any additional structural support, e.g., spacers. Further, the vacuum in the interior void 26 also reduces or eliminates any conductive and convective heat transfer between the sidewalls 22, 24 and through the interior void 26. Each of the units 16 may be independently transported to the project site for complete assembly of the system 10.

An elongated solar power collection rod 28 is housed within the interior void 26 and extends between the plates 18, 22. In the exemplary embodiment, the rod 28 is positioned in a center of the interior void 26. It is foreseen, however, that the rod 28 may be positioned anywhere within the interior void 26, including proximate to but not exactly on the focal point for the convex exterior sidewall 22, without deviating from the scope of the present inventive concept. The rod 28 contains a photovoltaic material to allow the system 10 via each of the rods 28 to convert solar radiation into direct current electricity, which may be used to provide power, e.g., lighting and/or air conditioning, to an interior of the enclosure 14.

Each of the sidewalls 22, 24 include a curved outer layer 36 and a curved inner layer 38. The layers 36, 38 are spaced from each other about an entire circumference of the unit 16 via a curved interlayer 40. The interlayer 40 secures the layers 36, 38 to each other and provides additional insulation to the unit 16.

Each of the end plates 18, 20 includes opposing outer and inner surfaces 46, 48. A frame 50 extends into the interior void 26 from the inner surface 48 of each of the end plates 18, 20. The frame 50 has an annular abutment ring 52 sized and shaped to extend into the interior void 26 and to slidably abut the inner layers 38 of the sidewalls 22, 24 to form a friction-fit engagement with seal therebetween. The inner surface 48 of the end plates 18, 20 abuts ends of the sidewalls 22, 24 to form a seal therebetween. An adhesive 51 is included between the end plates 18, 20 and the sidewalls 22, 24 along ends of the sidewalls 22, 24 and along the inner layers 38. The annular abutment ring 52 of the frame 50 is tapered toward a center of the frame 50. The frame 50 houses an insulating material 54 therein, which is surrounded by the annular abutment ring 52. The insulating material 54 is also tapered such that the annular abutment ring 52 and the insulating material 54 form a concave dome-shaped depression or concavity 56 having a continuous line between the annular abutment ring 52 and the insulating material 54. The rod 28 nests within the concavity 56 such that, in the exemplary embodiment, the rod 28 and the concavity 56 are coaxial.

Turning to FIGS. 4-7, each of the plurality of units 16 are vertically stacked and connected to another one of the plurality of units 16, in the exemplary embodiment, via an elongated vertical connector 60, and horizontally connected side-by-side to another one of the plurality of units 16 via an annular horizontal connector 62. Each of the connectors 60, 62 have a symmetrical shape and function as a gasket between adjacent parts of the units 16. Thus, each of the connectors 60, 62 space the units 16 from each other and form a portion of the thermal break. Each of the connectors 60, 62 are employed separately, but in pairs, to cooperatively form independent seals between adjacent units 16.

Each vertical connector 60 has upper and lower halves 68, 70 that cooperate with and are symmetrical to each other. A side surface 72 of each of the halves 68, 70 includes a projection 74 sized and shaped to extend into and mate with an annular groove 80 in each of the end plates 18, 20 with each of the halves 68, 70 abutting one of the end plates 18, 20, thereby forming a seal therebetween. In this manner, each of the vertical connectors 60 is configured to secure units 16 to each other in a vertically-stacked configuration and provide a seal therebetween.

Figure 6:
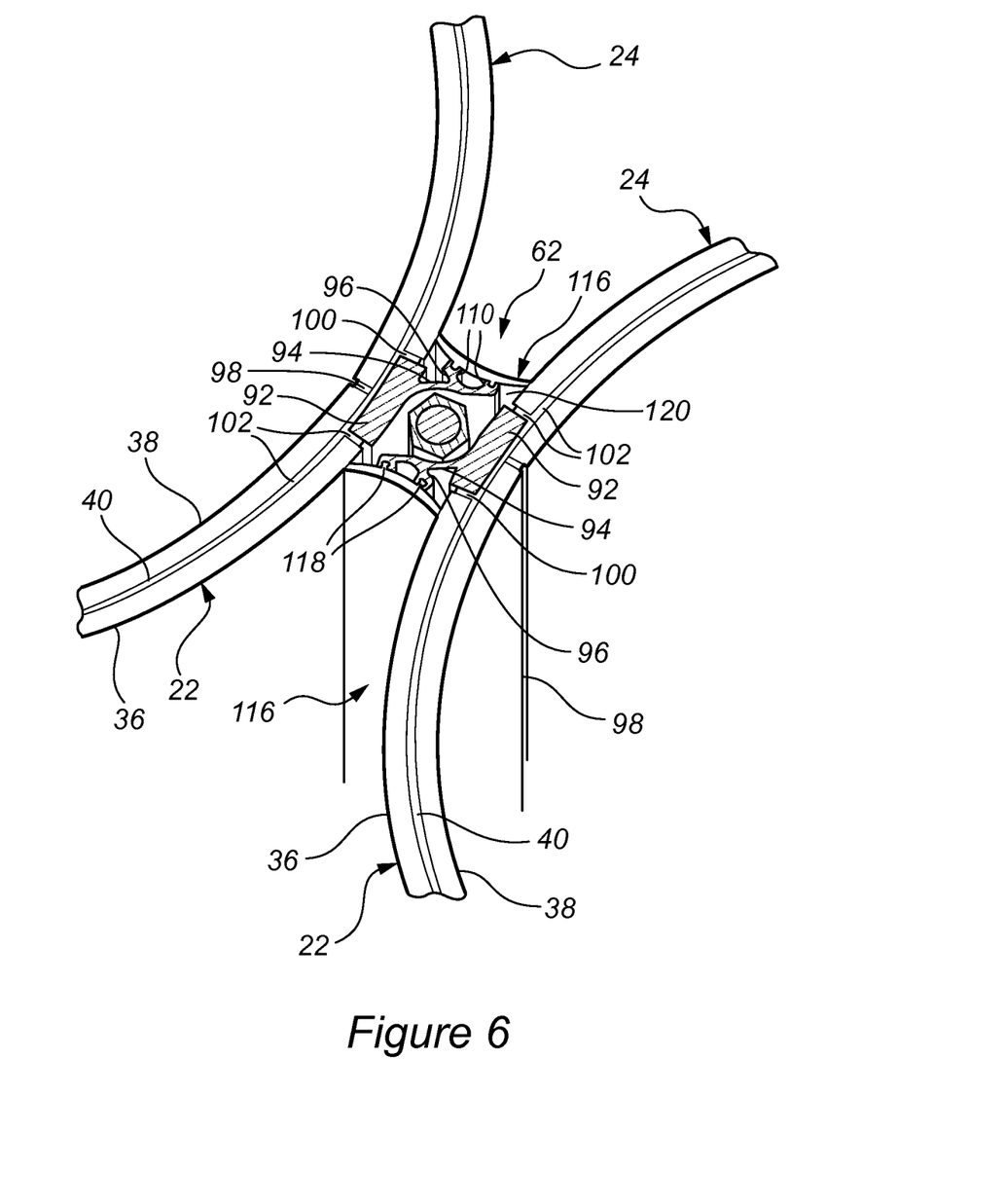
FIG. 6 is a magnified perspective view of the enclosure system as shown in FIG. 1, illustrating a horizontal connector connecting the tubular units of the enclosure system.
Figure 7:
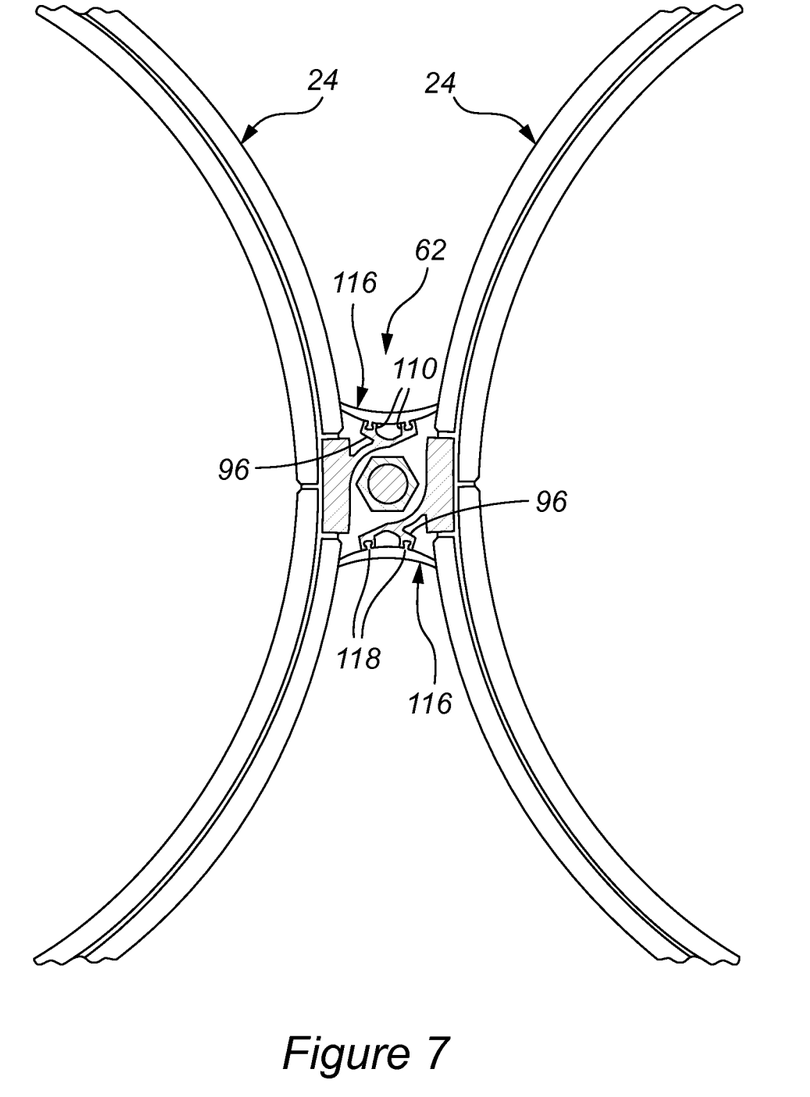
FIG. 7 is a plan view of the horizontal connector as shown in FIG. 6.

Each horizontal connector 62 has linearly-extending sealing components 88, 90 that cooperate with and are symmetrical to each other. Each of the components 88, 90 includes a base 92, a projection 94 extending away from the base 92, and a receiver 96 on a distal end of the projection 94 relative to the base 92. The base 92 of the horizontal connectors 62 is securely bonded to the outer layers 36 and the inner layers 38 of the sidewalls 22, 24. More specifically, the base 92 is bonded to the inner layers 38 and across an interior linear joint 98 between the inner layers 38 of the sidewalls 22, 24 so that the base 92 completely conceals and bridges the interior linear joint 98. Further, the base 92 is bonded to ends of the outer layers 36 and in an exterior linear joint 100 between the outer layers 36 of the sidewalls 22, 24. An adhesive 102 is provided between and at least partially about each of the horizontal connectors 62 and the sidewalls 22, 24 to function as the bond therebetween. In this manner, the horizontal connector 62 spaces only a portion of the sidewalls 22, 24, i.e., the outer surfaces 46 of the sidewalls 22, 24, from each other.

The receiver 96 includes a pair of arms 110 that partially receive a linearly-extending abutment strip 116. More specifically, each of the pair of arms 110 is sized and shaped to receive ridges 118 extending linearly along and from a rear surface 120 of each of the strips 116. In this manner, each of the strips 116 is secured to one of the receivers 96 along an entire length of thereof.

The rear surface 120 of each of the strips 116 abuts the outer layers 36 of adjacent ones of the units 16 to form a seal therebetween. The strips 116 are preferably made of an elastic material having a degree of resiliency to accommodate any offset between the adjacent ones of the units 16, e.g, offset due to heat-related expansion and/or assembly tolerances. In this manner, each of the horizontal connectors 62 is configured to secure units 16 to each other in a horizontal, side-by-side configuration and provide a weatherproof seal therebetween.

Each of the horizontal connectors 62 is arranged about and secured around an elongated assembly hangar rod 126 with a hangar rod nut 128. The assembly hangar rod 126 with the hangar rod nut 128 provides a framework for the system 10 to facilitate assembly thereof, and further provides increased structural integrity to the system 10 during use thereof.

Figure 8:
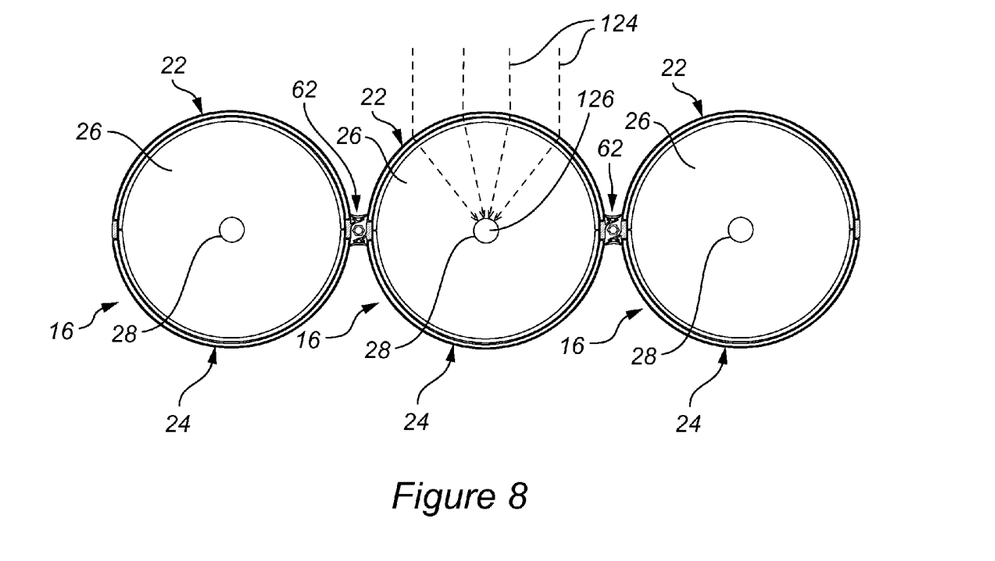
FIG. 8 is a plan view of a plurality of units as shown in FIG. 5, illustrating light focused on a solar power collection rod.

Turning to FIG. 8, the system 10, once completely assembled and in use, is configured to receive light 124, e.g., emitted from the sun and/or other light source, on the exterior sidewall 22 and/or the interior sidewall 24. The convex nature of the sidewalls 22, 24 provides a lens configured to refract or focus the solar radiation or light 124 incident on each of the units 16 so that the light 124 is directed to a focal point 130. The solar power collection rod 28 housed within the interior void 26 is positioned at the focal point 130 to receive the focused light 124 and at least partially block the light 124 from entering the enclosure 14, thereby reducing a solar heat gain of the enclosed interior space formed by the enclosure 14. In this manner, the system 10 maximizes solar power collection for the rod 28 at the focal point 130.

Each of the rods 28 are connected to each other, e.g., via electrical wiring connected to ends of each of the rods 28 and extending through each of the end plates 18, 20 to form a grid. It is foreseen that a battery may be connected to the grid to store electricity collected by the rods 28 and/or the grid may be wired to an electrical system of the enclosure 14.

Accordingly, the present inventive concept provides a modular building enclosure system having tubular components assembled in rows and columns that is structurally self supporting, thermally insulates an enclosure, and configured to direct light to a focal point to collect solar energy for use, e.g., in the enclosure, thereby minimizing need for external energy consumption, e.g., external energy necessary for use of the enclosure.

The foregoing description of an implementation of the invention has been presented for purposes of illustration and description. It is not exhaustive and does not limit the invention to the precise form disclosed. Modifications and variations are possible in light of the above teachings or may be acquired from practicing the invention. Accordingly, while various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A modular wall system having a plurality of evacuated air spaces to provide a thermal break, the system comprising:
    a plurality of thermally-broken interconnected units, each unit having a top end plate, a bottom end plate, a convex exterior sidewall, an interior sidewall, and an interior void defined by the top end plate, the bottom end plate, the convex exterior sidewall, and the interior sidewall, each unit configured to form at least a portion of the thermal break,
    wherein an outer surface of the exterior sidewall has a radius equal to or unequal to a radius of an outer surface of the interior sidewall such that, when the exterior sidewall and the interior sidewall are secured to each other, the exterior sidewall and the interior sidewall collectively form a tubular columnar member, and
    wherein,
    each of the sidewalls extends between the top end plate and the bottom end plate, and
    each of the units is connected (i) horizontally via a horizontal connector and/or (ii) vertically via a vertical connector.

2. The modular wall system of claim 1, wherein,
    each of the units includes a solar energy collection rod extending vertically within the interior void, and
    the rod is substantially positioned at a focal point defined by the convex exterior sidewall.

3. The modular wall system of claim 2,
    wherein the rod extends from the top end plate to the bottom end plate.

4. The modular wall system of claim 2,
    wherein the rod contains a photovoltaic material.

5. The modular wall system of claim 4,
    wherein the photovoltaic material is monocrystalline silicon, polycrystalline silicon, amorphous silicon, cadmium telluride, or copper indium gallium selenide/sulfide.

6. The modular wall system of claim 1,
    wherein the interior void is partially or completely evacuated of gases.

7. The modular wall system of claim 1,
    wherein,
    each of the exterior sidewall and the interior sidewall includes an outer layer and an inner layer, and
    the outer layer and inner layer are spaced from each other via an interlayer.

8. The modular wall system of claim 1,
    wherein the interior sidewalls are bonded together at interior linear joints therebetween via an adhesive.

9. The modular wall system of claim 1,
    wherein,
    each of the top end plate and the bottom end plate includes a groove about a circumference thereof,
    the groove configured to partially receive a side surface of a gasket, and
    the side surface of the gasket abuts plates of adjacent ones of the plurality of interconnected units.

10. The modular wall system of claim 1,
    wherein,
    each of the top end plate and the bottom end plate includes a frame projecting into the interior void,
    the frame is secured to the exterior sidewall and the interior sidewall via an adhesive bond, and
    the frame houses an insulating material therein.

11. A modular wall system having a plurality of evacuated air spaces to provide a thermal break, the system comprising:
    a plurality of thermally-broken interconnected units, each unit having a top end plate, a bottom end plate, a convex exterior sidewall, an interior sidewall, and an interior void defined by the top end plate, the bottom end plate, the convex exterior sidewall, and the interior sidewall, each unit configured to form at least a portion of the thermal break,
    wherein the interior sidewalls are bonded together at interior linear joints therebetween via an adhesive, and
    wherein, each of the sidewalls extends between the top end plate and the bottom end plate, and
    each of the units is connected (i) horizontally via a horizontal connector and/or (ii) vertically via a vertical connector.

12. The modular wall system of claim 11,
    wherein,
    the exterior sidewalls are bonded to a spacer at exterior linear joints therebetween via an adhesive.

13. The modular wall system of claim 12,
    wherein the interior linear joints are horizontally displaced from the exterior linear joints.

14. The modular wall system of claim 12,
wherein the spacer (i) extends along the interior linear joint, (ii) spaces the exterior sidewalls from each other, and (iii) includes a projection with a receiver at a distal end thereof.

15. The modular wall system of claim 14,
wherein the projection (i) extends obliquely from the spacer, and (ii) includes a contoured outer surface to at least partially receive a fastener.

16. The modular wall system of claim 15,
wherein, the spacer cooperates with another spacer of an adjacent one of the plurality of interconnected units to completely surround a perimeter of the fastener, and the spacer and the another spacer form a remaining portion of the thermal break.

17. The modular wall system of claim 16,
wherein,
the another spacer of the adjacent one of the plurality of interconnected units (i) extends along an interior linear joint of the adjacent one of the plurality of interconnected units, (ii) spaces the exterior sidewalls of adjacent units from each other, and (iii) includes a projection with a receiver at a distal end thereof,
the projection (i) extends obliquely from the spacer, and (ii) includes a contoured outer surface to at least partially receive a fastener, and
the receiver includes vertical grooves extending parallel to each other along a length of the receiver, the grooves configured to partially receive a rear surface of a gasket, the rear surface of the gasket abutting exterior sidewalls of adjacent ones of the plurality of interconnected units.

18. The modular wall system of claim 14,
wherein,
the receiver includes vertical grooves extending parallel to each other along a length of the receiver,
the grooves are configured to partially receive a rear surface of a gasket, and
the rear surface of the gasket abuts exterior sidewalls of adjacent ones of the plurality of interconnected units.

19. The modular wall system of claim 14,
wherein the projection (i) extends obliquely from the spacer, and (ii) includes a contoured outer surface to at least partially receive a fastener.

20. A method of erecting a modular wall system in a grid, the method comprising the steps of:
positioning a solar energy receiver within each interior void of a plurality of units, each unit having a top end plate, a bottom end plate, an exterior sidewall, and an interior sidewall, the interior void defined by the top end plate, the bottom end plate, the convex exterior sidewall, and the interior sidewall;
wherein an outer surface of the exterior sidewall has a radius equal to or unequal to a radius of an outer surface of the interior sidewall such that, when the exterior sidewall and the interior sidewall are secured to each other, the exterior sidewall and the interior sidewall collectively form a tubular columnar member
evacuating each of the interior voids of gases; and
connecting the plurality of units to form the grid,
wherein each of the solar energy receivers is positioned at a focal point defined by the exterior sidewall.

\* \* \* \* \*